(12) United States Patent
Kolics et al.

(10) Patent No.: US 9,818,617 B2
(45) Date of Patent: Nov. 14, 2017

(54) METHOD OF ELECTROLESS PLATING USING A SOLUTION WITH AT LEAST TWO BORANE CONTAINING REDUCING AGENTS

(71) Applicant: Lam Research Corporation, Fremont, CA (US)

(72) Inventors: Artur Kolics, Dublin, CA (US); Praveen Nalla, Fremont, CA (US); Xiaomin Bin, San Jose, CA (US); Nanhai Li, Pleasanton, CA (US); Yaxin Wang, Fremont, CA (US); Patrick Little, Brentwood, CA (US); Marina Polyanskaya, Morgan Hill, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/372,785

(22) Filed: Dec. 8, 2016

(65) Prior Publication Data
US 2017/0092499 A1    Mar. 30, 2017

Related U.S. Application Data

(62) Division of application No. 14/297,352, filed on Jun. 5, 2014, now Pat. No. 9,551,074.

(51) Int. Cl.
| | |
|---|---|
| *H01L 21/00* | (2006.01) |
| *H01L 21/288* | (2006.01) |
| *C23C 18/34* | (2006.01) |
| *C23C 18/16* | (2006.01) |
| *C23C 18/50* | (2006.01) |

(52) U.S. Cl.
CPC ........ *H01L 21/288* (2013.01); *C23C 18/1637* (2013.01); *C23C 18/34* (2013.01); *C23C 18/50* (2013.01)

(58) Field of Classification Search
CPC ........ C23C 18/34; C23C 18/16; H01L 21/288
USPC .......................................................... 438/5
See application file for complete search history.

(56) References Cited

U.S. PATENT DOCUMENTS

| | | | |
|---|---|---|---|
| 4,279,951 A | 7/1981 | Hough et al. | |
| 2003/0113576 A1* | 6/2003 | Chebiam | C23C 18/34 428/670 |
| 2003/0141018 A1* | 7/2003 | Stevens | H01L 21/67126 156/345.51 |
| 2005/0048773 A1* | 3/2005 | Mathew | H01L 21/288 438/678 |
| 2005/0136193 A1 | 6/2005 | Weidman et al. | |
| 2005/0161338 A1 | 7/2005 | Fang et al. | |
| 2005/0181226 A1* | 8/2005 | Weidman | C23C 18/1619 428/544 |
| 2006/0128133 A1* | 6/2006 | Christenson | C23C 18/1628 438/610 |

(Continued)

*Primary Examiner* — Caleb Henry
(74) *Attorney, Agent, or Firm* — Beyer Law Group LLP

(57) ABSTRACT

A solution for providing electroless deposition of a metal layer on a substrate is provided. A solvent is provided. A metal precursor is provided to the solvent. A first borane containing reducing agent is provided to the solvent. A second borane containing reducing agent is provided to the solvent, wherein the first borane containing reducing agent has a deposition rate of at least five times a deposition rate of the second borane containing reducing agent, and wherein the solution is free of nonborane reducing agents.

6 Claims, 3 Drawing Sheets

(56) References Cited

U.S. PATENT DOCUMENTS

| | | | |
|---|---|---|---|
| 2006/0252252 A1* | 11/2006 | Zhu | B82Y 30/00 438/618 |
| 2008/0099799 A1* | 5/2008 | Mathew | H01L 24/11 257/276 |
| 2008/0268635 A1* | 10/2008 | Yu | C23C 16/0227 438/655 |
| 2009/0155468 A1* | 6/2009 | Petrov | C23C 18/1617 427/306 |
| 2010/0075496 A1* | 3/2010 | Chen | H01L 21/02068 438/653 |
| 2011/0192316 A1* | 8/2011 | Chou | C23C 18/34 106/1.22 |
| 2011/0195542 A1* | 8/2011 | Chou | C23C 18/1879 438/98 |
| 2011/0195569 A1* | 8/2011 | Moon | H01L 21/28562 438/643 |
| 2012/0177821 A1* | 7/2012 | Levey | B01J 23/40 427/230 |
| 2014/0072706 A1* | 3/2014 | Long | C23C 18/1844 427/125 |

* cited by examiner

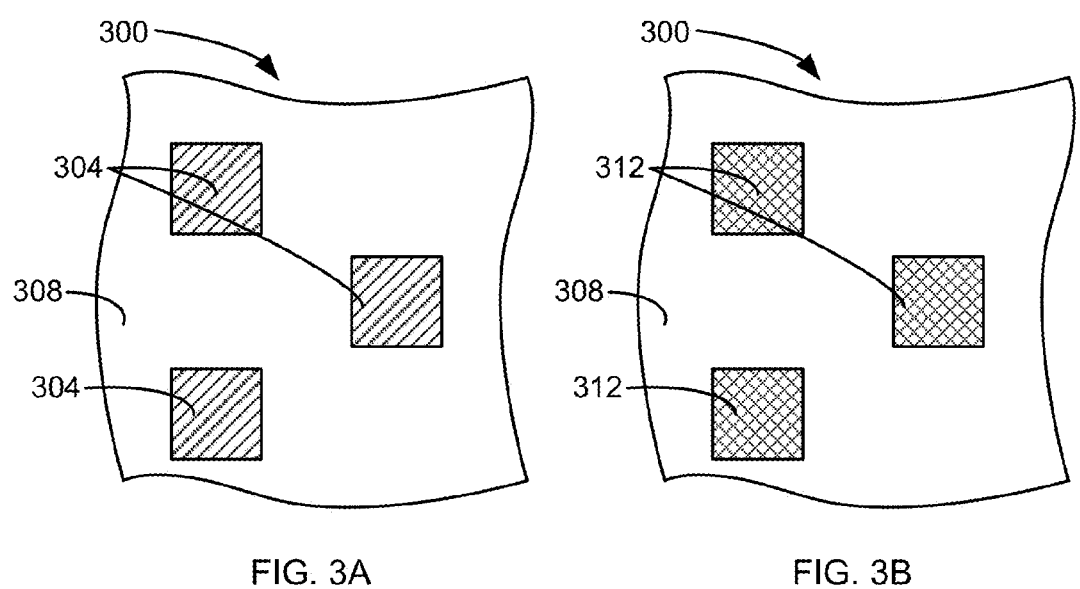

METHOD OF ELECTROLESS PLATING USING A SOLUTION WITH AT LEAST TWO BORANE CONTAINING REDUCING AGENTS

CROSS REFERENCE TO RELATED APPLICATIONS

This application is a divisional of and claims priority to pending U.S. application Ser. No. 14/297,352 filed on Jun. 5, 2014 and entitled "ELECTROLESS PLATING SOLUTION WITH AT LEAST TWO BORANE CONTAINING REDUCING AGENTS," which is incorporated herein by reference in its entirety for all purposes.

BACKGROUND OF THE INVENTION

Field of the Invention

The invention relates to a method of forming semiconductor devices on a semiconductor wafer. More specifically, the invention relates to depositing metal containing layers to form semiconductor devices.

In forming semiconductor devices, metal containing layers may be deposited. Such a deposition may be provided by electroplating.

SUMMARY OF THE INVENTION

To achieve the foregoing and in accordance with the purpose of the present invention, a solution for providing electroless deposition of a metal layer on a substrate is provided. A solvent is provided. A metal precursor is provided to the solvent. A first borane containing reducing agent is provided to the solvent. A second borane containing reducing agent is provided to the solvent, wherein the first borane containing reducing agent has a deposition rate of at least two times a deposition rate of the second borane containing reducing agent, and wherein the solution is free of nonborane reducing agents.

In another manifestation of the invention, a solution for providing electroless deposition of a metal layer on a substrate is provided. A solvent is provided. A metal precursor is provided to the solvent. Borane dimethylamine is provided to the solvent. Morpholine borane is provided to the solvent.

In another manifestation of the invention, a method for providing electroless deposition of a metal layer on a substrate is provided. The substrate is exposed to an electroless metal deposition, comprising a metal precursor, first borane containing reducing agent, and a second borane containing reducing agent, wherein the first borane containing reducing agent has a deposition rate that is at least five times a deposition rate of the second borane containing reducing agent.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 3A-B are schematic views of the formation of structures using the inventive process.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Electroless metal/metal alloy plating solutions are generally made up of one or more metal salts, a reducing agent, one or more complexing agents, one or more pH adjustors, a buffering agent, surfactant and additives if needed. In most cases, one type of reducing agent in the bath is sufficient. If the primary reducing agent is not catalytically active on the metal to be plated, the deposition cannot proceed. To overcome this difficulty the substrate surface is activated usually by another more catalytic metal or another reducing agent is added, in addition to primary reducing agent, into the solution. This secondary reducing agent initiates the deposition reaction on the substrate surface. After this step, the primary reducing agent can take over the deposition reaction. Another possible purpose is to use two different reducing agents to add additional alloying elements into the alloy to be plated. For instance, a CoWP deposition solution that contains hypophosphite as the primary reducing agent will have usually less than 1 atomic % boron in the film if a borane reducing agent is added to the deposition solution.

Among the commonly used reducing agents boranes are a special category because their reactivity is strongly influenced by the compound they formed a complex with. Using two or more boranes present in the solution as different complexes usually do not provide any of the above benefits. However, it has been unexpectedly found, such combination may be helpful in adjusting the bath stability, initiation time, as well as deposition rate of the solution without changing the concentration of the other non-borane solution components. In addition, the composition of the alloy using the combination of boranes closely matches the composition of the deposit obtained with single borane source.

Figure 1:
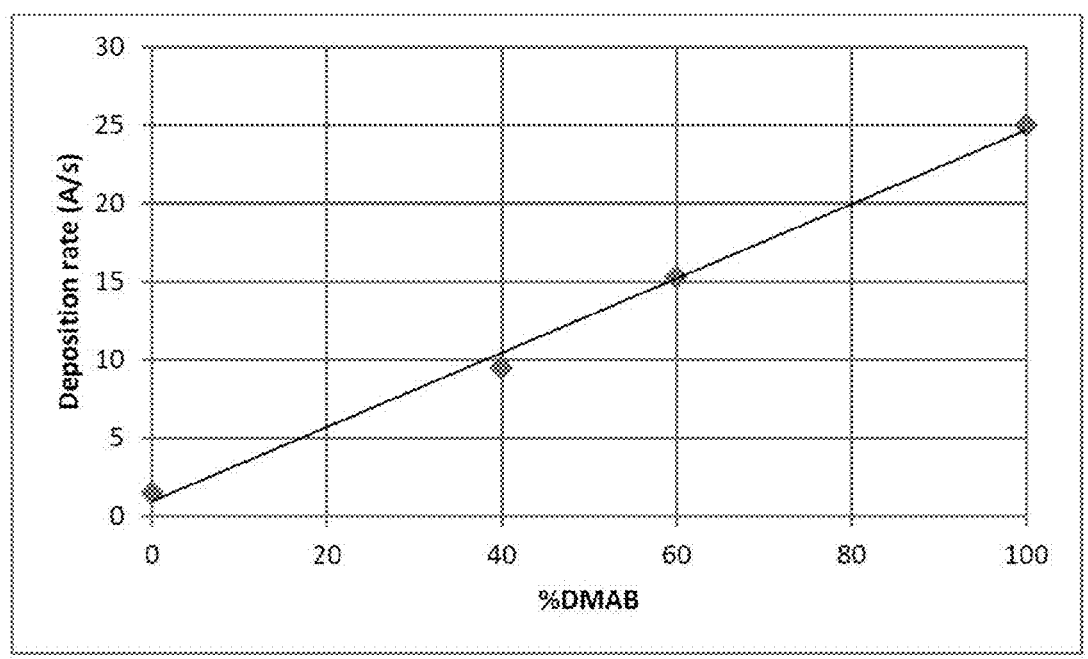
FIG. 1 is a graph of deposition rate in angstroms per second versus percentage of DMAB.

The deposition rate impact is strongest when there are only borane types of reducing agents in the solution. For instance, in presence of large amount of hypophosphite the deposition rate effect is significantly muted. It was also found that the deposition rate can be conveniently adjusted by the ratio and concentration of different boranes. FIG. 1 illustrates the effect of borane mixtures (morpholine borane and DMAB) on deposition rate by providing a graph of deposition rate in angstroms per second versus percentage of DMAB.

Such an example of deposition rate adjustment using two borane reducing agents in a solution was found for the deposition of CoMoB alloy. When borane dimethylamine complex is used as reducing agent a deposition rate of 25 Angstrom/s is obtained. Changing the reducing agent to borane morpholine complex the deposition rate reduced to 1.5 Angstrom/s. While 25 Angstrom/s is too high to controllably deposit thin films (~100 Angstrom), 1.5 Angstrom/s is too slow. In addition, borane dimethylamine as the sole reducing agent causes the solution to become unstable. It has been unexpectedly found that a mixture of dimethylamine borane and morpholine borane provides a stable solution, where the morpholine borane does not completely mask the deposition rate provided by dimethylamine borane. To achieve a deposition rate between these values a mixture of dimethylamine and morpholine complexes can be used.

The deposition rate reducing effect of morpholine borane works with other borane reducing agents as well. Such borane reducing agents can be diethylamine borane, tert-butylamine borane, ammonia borane, and dimethylsulfide borane.

In another embodiment, a solution may use two different borane reducing agents to simultaneously adjust multiple film properties. One reducing agent can shorten initiation time, but may cause high roughness. The other reducing agent would reduce the roughness, but have a longer initiation time. The combination of two provide a low roughness deposit (see Figure) and can meet the short initiation time requirement. In an alternative embodiment, one reducing agent may provide fast initiation, but may cause nodule formation. Another reducing agent may have slower initiation, but may prevent or reduce nodule formation.

Figure 2:
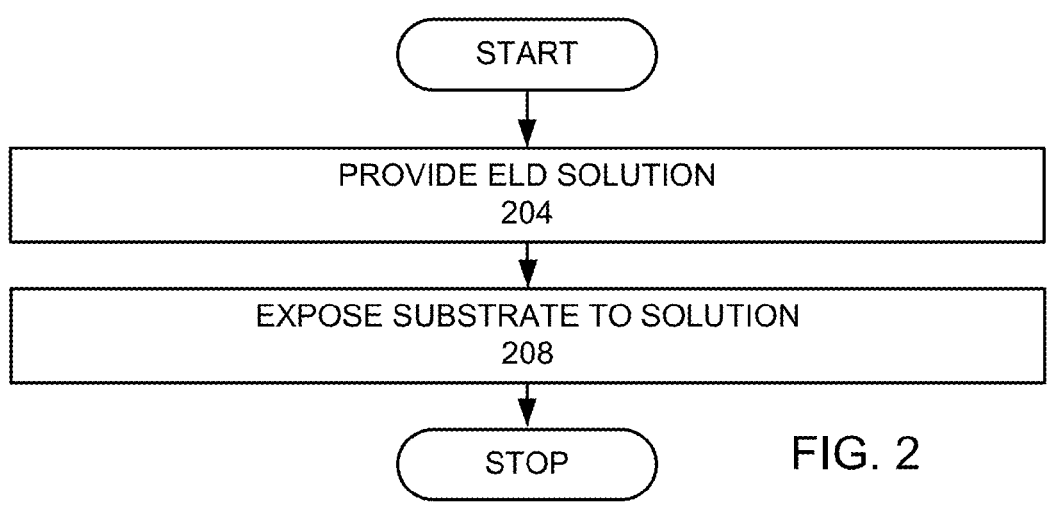
FIG. 2 is a flow chart of an embodiment of the invention.

FIG. 2 is a high level flow chart of an embodiment of the invention. In this embodiment, an electroless deposition solution is provided, comprising a solvent, a metal precursor, dimethylamine borane (DMAB), and morpholine borane (step 204). A substrate is exposed to the solution (step 208).

In a preferred embodiment of the invention, an electroless deposition solution comprising a solvent, a metal precursor, dimethylamine borane (DMAB), and morpholine borane is provided (step 204). This embodiment uses an aqueous solution.

A substrate is exposed to the electroless deposition solution. In this example, the substrate is a dielectric substrate with patterned metal surfaces. FIG. 3A is a partial view of a substrate 300 with a plurality of metal pattern surfaces 304 and dielectric surfaces 308. In this embodiment, the metal pattern surfaces 304 are copper. In this embodiment, the substrate is placed in a bath of the electroless deposition.

In this embodiment, the solution plates the metal pattern surfaces 304 with a cobalt molybdenum boron (CoMoB) layer. In the bath, borane dimethylamine complex acts as a reducing agent providing CoMoB deposition on the copper, since borane dimethylamine complex provides a faster deposition rate of 25 Å/s, which is needed to speed the initial deposition on the copper surface 304. After a layer of CoMoB has been initially deposited on the copper surface 304, the borane morpholine complex deposition increases. FIG. 3B is a partial view of the substrate 300 after a CoMoB layer 312 has been deposited.

This embodiment provides a fast deposition by using a faster borane complex, while providing deposition control, by providing a slower borane complex. If a faster borane complex is used by itself, the resulting solution would be too unstable. Other reducing agents may mask the faster borane complex, slowing the overall process. It has been unexpectedly found that by adding a slower borane complex to the faster borane complex, the overall process is not slowed, but the resulting solution is made more stable. This embodiment also allows additional control of alloy additives in the resulting deposition.

In other embodiments, the metal precursor is at least one of a cobalt precursor, a nickel, precursor, a copper precursor, or a molybdenum precursor. In other embodiments, the solvent is water, dimethyl sulfoxide (DMSO), ethylene glycol, or ionic liquids. Preferably, the solution is hypophosphite free. Preferably, the solution further comprises at least one of a complexing agent, a surfactant, or a pH adjustment agent. In other embodiments, the pH and complexing agent may be adjusted so that boron is not deposited the resulting deposited metal layer.

In other embodiments after a deposition is initiated using more than one borane containing reducing agent, a single reducing agent may be used for further deposition. In other embodiments, three or four borane containing reducing agents may be used.

When borane dimethylamine complex is used as the reducing agent a deposition rate of 25 Angstrom/s is obtained. When borane morpholine complex is used as the reducing agent the deposition rate reduced to 1.5 Angstrom/s. Therefore, in this embodiment the deposition rate of the first borane containing reducing agent, borane dimethylamine complex, with a deposition rate of 25 Angstrom/s, which is more than 16 times greater than the deposition rate of the second borane containing reducing agent, borane morpholine complex with a deposition rate of 1.5 Angstrom/s. Preferably, the first borane containing reducing agent has a deposition rate at least five times the deposition rate of the second borane containing reducing agent. More preferably, the first borane containing reducing agent has a deposition rate at least ten times the deposition rate of the second borane containing reducing agent. Most preferably, the first borane containing reducing agent has a deposition rate at least fifteen times the deposition rate of the second borane containing reducing agent. Such solutions are free of non-borane containing reducing agents.

In another embodiment, two solutions, where each solution has a different borane reducing agent, are sequentially used. For example, a more active borane reducing agent may be applied in a first solution to quickly initiate deposition with no selectivity loss. Such a solution can be a non-recirculatable process, which might use and then discard the solution. Next, a solution with a less active borane reducing agent may be used to provide a more stable process. Such a solution may be recirculated. It is expected that the more reactive boranes will provide faster initiation time (the time needed to start the deposition reaction on a substrate) and lower bath stability (higher propensity for homogeneous plating reaction). However, an unexpected outcome of the tests done with different borane shows that while tert-butylamine borane provide higher deposition rate than morpholine borane the latter one initiates faster consequently providing better selectivity. DMAB which provides higher deposition rate than morpholine borane can give higher bath stability.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for providing electroless deposition of a metal layer on a substrate, comprising:

exposing the substrate to an electroless metal deposition solution, comprising a metal precursor, first borane containing reducing agent, and a second borane containing reducing agent, wherein the first borane containing reducing agent has a deposition rate that is at least five times a deposition rate of the second borane containing reducing agent, wherein the solution is free of nonborane reducing agents.

2. The method, as recited in claim 1, wherein the metal precursor comprises at least one of a cobalt precursor, a nickel precursor, a copper precursor, an iron precursor or a palladium precursor.

3. The method, as recited in claim 2, wherein the first borane containing reducing agent is at least one of tert-butylamine borane, ammonia borane, dimethylsulfide borane or dimethylamine borane (DMAB) and the second borane containing reducing agent is morpholine borane.

4. The method, as recited in claim 1, wherein the first borane containing reducing agent comprises borane dimethylamine and the second borane containing reducing agent comprises morpholine borane.

5. The method, as recited in claim 1, wherein the first borane containing reducing agent is at least one of tert-butylamine borane, ammonia borane, dimethylsulfide borane or dimethylamine borane (DMAB) and the second borane containing reducing agent is morpholine borane.

6. A method for providing electroless deposition of a metal layer on a substrate, comprising:

exposing the substrate to an electroless metal deposition solution, comprising a metal precursor, first borane containing reducing agent, and a second borane containing reducing agent, wherein the first borane containing reducing agent has a deposition rate that is at least five times a deposition rate of the second borane containing reducing agent, wherein the exposing the substrate to an electroless metal deposition solution, comprising:

exposing the substrate to a first electroless metal deposition solution, comprising the metal precursor and the first borane containing reducing agent, wherein the solution is free of nonborane reducing agents; and subsequently exposing the substrate to a second electroless metal deposition solution, comprising the metal precursor and the second borane containing reducing agent, wherein the solution is free of nonborane reducing agents.

* * * * *